United States Patent
Lin et al.

(10) Patent No.: US 12,464,639 B2
(45) Date of Patent: Nov. 4, 2025

(54) SEMICONDUCTOR PACKAGE HAVING FLOW-GUIDING GROOVES AND CIRCUIT BOARD THEREOF

(71) Applicant: CHIPBOND TECHNOLOGY CORPORATION, Hsinchu (TW)

(72) Inventors: Wei-Teng Lin, Hsinchu County (TW); Hui-Yu Huang, Hsinchu (TW); Ching-Chi Chan, Taichung (TW); Shih-Chieh Chang, Chiayi County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 456 days.

(21) Appl. No.: 18/143,133

(22) Filed: May 4, 2023

(65) Prior Publication Data
US 2024/0008171 A1    Jan. 4, 2024

(30) Foreign Application Priority Data

Jun. 30, 2022   (TW) .................................. 111124552

(51) Int. Cl.
*H05K 1/02* (2006.01)
*H01L 23/00* (2006.01)
*H01L 23/498* (2006.01)

(52) U.S. Cl.
CPC ..... *H05K 1/0272* (2013.01); *H01L 23/49838* (2013.01); *H01L 23/4985* (2013.01);
(Continued)

(58) Field of Classification Search
CPC ......... H01L 21/563; H01L 2224/26175; H01L 23/49838; H05K 1/0272
See application file for complete search history.

(56) References Cited

U.S. PATENT DOCUMENTS

| | | |
|---|---|---|
| 2001/0013641 A1 | 8/2001 | Onodera et al. |
| 2006/0175088 A1* | 8/2006 | Lin ..................... H01L 23/3121 257/E23.125 |
| 2021/0257287 A1 | 8/2021 | Ma et al. |

FOREIGN PATENT DOCUMENTS

| | | |
|---|---|---|
| CN | 102709198 A | 10/2012 |
| JP | 2000-306958 A | 11/2000 |

(Continued)

OTHER PUBLICATIONS

Japanese notice of allowance mailed Apr. 5, 2024 for Japanese patent application No. 2023-076285, 3 pages.
(Continued)

*Primary Examiner* — Davienne N Monbleau
*Assistant Examiner* — Emily Farmer
(74) *Attorney, Agent, or Firm* — Demian K. Jackson; Jackson IPG PLLC

(57) ABSTRACT

A semiconductor package includes a chip, a circuit board and a filling material. The circuit board includes a substrate, a patterned metal layer and a protective layer. A circuit area, a chip-mounting area and a flow-guiding area are defined on a surface of the substrate. The chip is mounted on the chip-mounting area. A flow-guiding member of the patterned metal layer is arranged on the flow-guiding area and includes a hollow portion and flow-guiding grooves which are communicated with the hollow portion and arranged radially. The flow-guiding grooves are provided to allow the protective layer to flow toward the hollow portion, and the hollow portion and the flow-guiding grooves are provided to allow the filling material to flow toward the protective layer such that the filling material can cover the protective layer to improve structural strength of the semiconductor package.

18 Claims, 9 Drawing Sheets

(52) U.S. Cl.
CPC .... *H01L 24/32* (2013.01); *H01L 2224/26175* (2013.01); *H01L 2224/32225* (2013.01); *H01L 2924/15151* (2013.01)

(56) References Cited

FOREIGN PATENT DOCUMENTS

| | | | |
|---|---|---|---|
| JP | 2001-230274 | A | 8/2001 |
| JP | 2005-175113 | A | 6/2005 |
| JP | 2006-216950 | A | 8/2006 |
| JP | 2009289914 | A * | 12/2009 |
| JP | 3228842 | U | 11/2020 |
| JP | 2021-129099 | A | 9/2021 |
| KR | 10-2021-0023118 | A | 3/2021 |
| KR | 10-2021-0104527 | A | 8/2021 |
| TW | 201421619 | A | 6/2014 |
| TW | 201943032 | A | 11/2019 |
| TW | M624524 | | 3/2022 |

OTHER PUBLICATIONS

Taiwanese Office Action mailed May 4, 2023 for Taiwanese Patent Application No. 111124552, 11 pages.
Korean notice of allowance mailed Mar. 4, 2025 for Korean patent application No. 10-2023-0058987, 2 pages.

\* cited by examiner

SEMICONDUCTOR PACKAGE HAVING FLOW-GUIDING GROOVES AND CIRCUIT BOARD THEREOF

FIELD OF THE INVENTION

This invention relates to a semiconductor package and its circuit board, and more particularly to a semiconductor package and its circuit board having flow-guiding grooves used to guide flowing of a protective layer and a filling material.

BACKGROUND OF THE INVENTION

As shown in FIG. 1, a conventional circuit board 10 includes a substrate 11, circuit lines 12 and a protective layer 13. A circuit area 11b and a chip-mounting area 11c are defined on a surface 11a of the substrate 11, the circuit lines 12 are arranged on the circuit area 11b, and inner leads 12a of the circuit lines 12 are located on the chip-mounting area 11c. The protective layer 13 covers the circuit lines 12, except the inner leads 12a. A chip 20 is mounted on the chip-mounting area 11c and electrically connected to the inner leads 12a. An underfill 30 is provided between the circuit board 10 and the chip 20 to obtain a conventional semiconductor package.

With reference to FIGS. 1 and 2, the protective layer 13 is provided on the circuit area 11b to cover the circuit lines 12 but it may not flow sufficiently to cover the area located corner outside of the chip-mounting area 11c, and the underfill 30 is filled between the circuit board 10 and the chip 20 but the underfill 30 also may not flow sufficiently to cover corner outside of the chip-mounting area 11c. As a result, an area 11d located between the protective layer 13 and the underfill 30 may expose the surface 11a of the substrate 11. Owing to the area 11d not covered by the protective layer 13 and the underfill the underfill 30 may be peeled off from the substrate 11 during peeling test to lower structural strength of the semiconductor package and cause the inner leads 12a to be damaged and separated from the circuit lines 12.

SUMMARY

One object of the present invention is to provide at least one flow-guiding member which is located outside of a corner of a chip-mounting area defined on a substrate. The flow-guiding member includes a hollow portion and flow-guiding grooves which are arranged radially and communicated with the hollow portion. The flow-guiding grooves are provided to allow a protective layer covering the circuit lines to flow toward the hollow portion and allow a filling material provided between the chip and the circuit board to flow toward the protective layer from the corner and cover the protective layer located in the flow-guiding grooves.

A semiconductor package of the present invention includes a circuit board, a chip and a filling material. The circuit board includes a substrate, a patterned metal layer and a protective layer. A circuit area, a chip-mounting area and a flow-guiding area are defined on a surface of the substrate, and the circuit area is located outside of the chip-mounting area. A first boundary line and a second boundary line of the chip-mounting area intersect at a corner of the chip-mounting area, a first imaginary line extends from the first boundary line, a second imaginary line extends from the second boundary line, and the flow-guiding area is defined between the first and second imaginary lines. The patterned metal layer includes circuit lines and at least one flow-guiding member. The circuit lines are arranged on the circuit area and each includes an inner lead which is located on the chip-mounting area. The flow-guiding member is arranged on the flow-guiding area and includes a hollow portion and flow-guiding grooves, the hollow portion is located adjacent to the corner and located between the corner and the flow-guiding grooves, and the flow-guiding grooves are communicated with the hollow portion and arranged radially. Each of the flow-guiding grooves includes a first guiding portion and a second guiding portion which are communicated with each other, the first guiding portion is located between the hollow portion and the second guiding portion, and it is communicated with the hollow portion. The protective layer is filled in the second guiding portion and covers the circuit lines, but the protective layer does not cover the inner lead of each of the circuit lines, the hollow portion and the first guiding portion. The chip is mounted on the chip-mounting area and electrically connected to the inner lead of each of the circuit lines. The filling material is filled between the circuit board and the chip and is provided to cover the hollow portion, the first guiding portion of each of the flow-guiding grooves and the protective layer located in the second guiding portion of each of the flow-guiding grooves. The protective layer and the filling material located in the second guiding portion are overlapped to become a first overlapped bonding layer.

A circuit board of the present invention includes a substrate, a patterned metal layer and a protective layer. A circuit area, a chip-mounting area and a flow-guiding area are defined on a surface of the substrate, the circuit area is located outside of the chip-mounting area, and the chip-mounting area is provided for a chip. A first boundary line and a second boundary line of the chip-mounting area intersect at a corner of the chip-mounting area, a first imaginary line extends from the first boundary line, a second imaginary line extends from the second boundary line, and the flow-guiding area is defined between the first and second imaginary lines. The patterned metal layer includes circuit lines and at least one flow-guiding member. The circuit lines are arranged on the circuit area and each includes an inner lead which is located on the chip-mounting area and provided to be electrically connected to the chip. The flow-guiding member is arranged on the flow-guiding area and includes a hollow portion and flow-guiding grooves, the hollow portion is located adjacent to the corner and located between the corner and the flow-guiding grooves, and the flow-guiding grooves are communicated with the hollow portion and arranged radially. Each of the flow-guiding grooves includes a first guiding portion and a second guiding portion which are communicated with each other, the first guiding portion is located between the hollow portion and the second guiding portion, and it is communicated with the hollow portion. The protective layer is filled in the second guiding portion and covers the circuit lines, but the protective layer does not cover the inner lead of each of the circuit lines, the hollow portion and the first guiding portion.

In the present invention, the second guiding portions of the flow-guiding grooves arranged radially are provided to direct the protective layer to flow toward the first guiding portions of the flow-guiding grooves and the hollow portion, and the hollow portion and the first guiding portions of the flow-guiding grooves are provided to direct the filling material to flow toward the second guiding portions of the flow-guiding grooves from the corner. Thus, the filling material can cover the protective layer and can be overlapped with the protective layer. It is available to increase structural strength of the semiconductor package of the present invention, prevent the filling material from peeling off from the substrate, and prevent the inner leads from breaking away from the circuit lines.

DETAILED DESCRIPTION OF THE INVENTION

Figure 1:
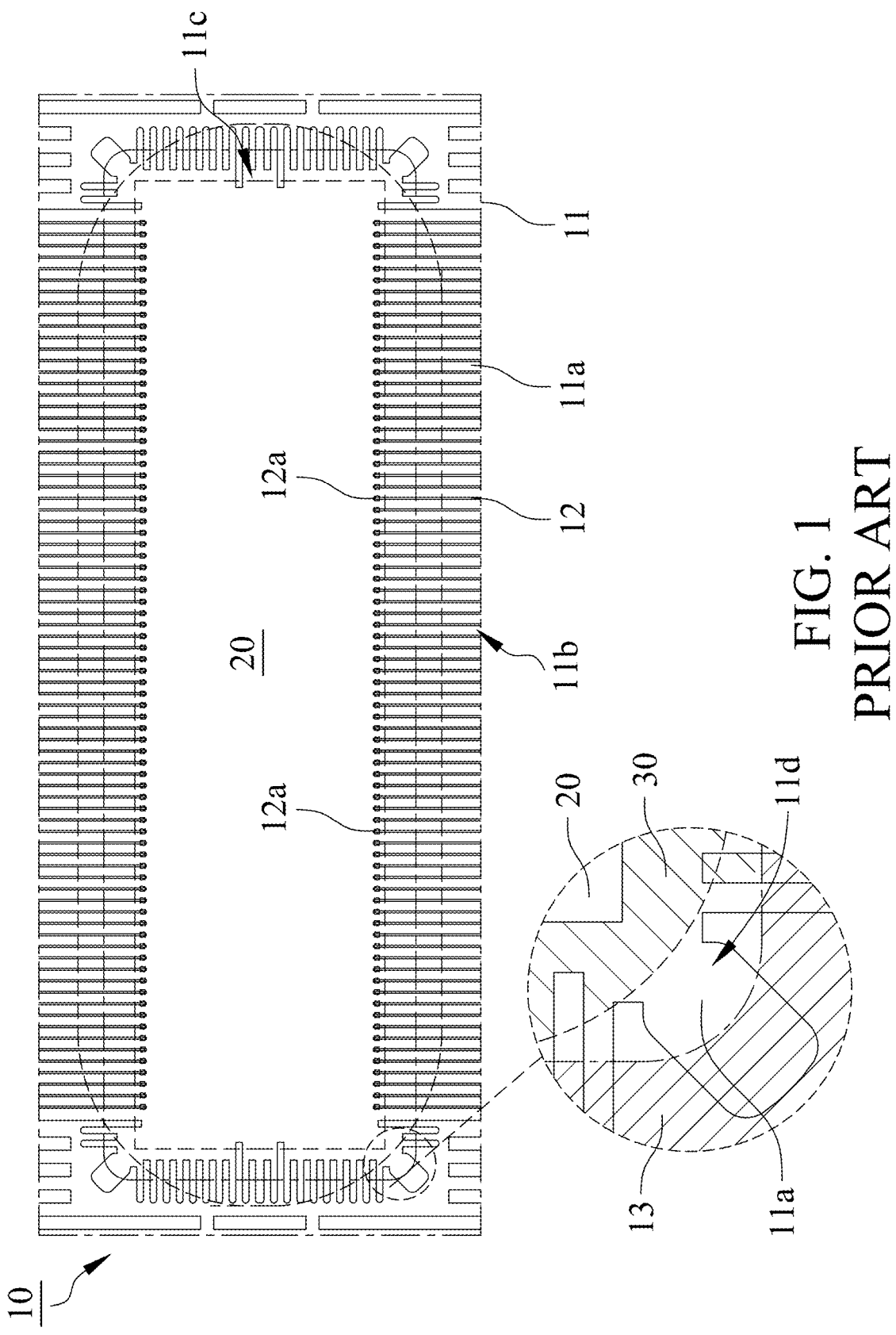
FIG. 1 is a top view diagram illustrating a conventional semiconductor package.
Figure 2:
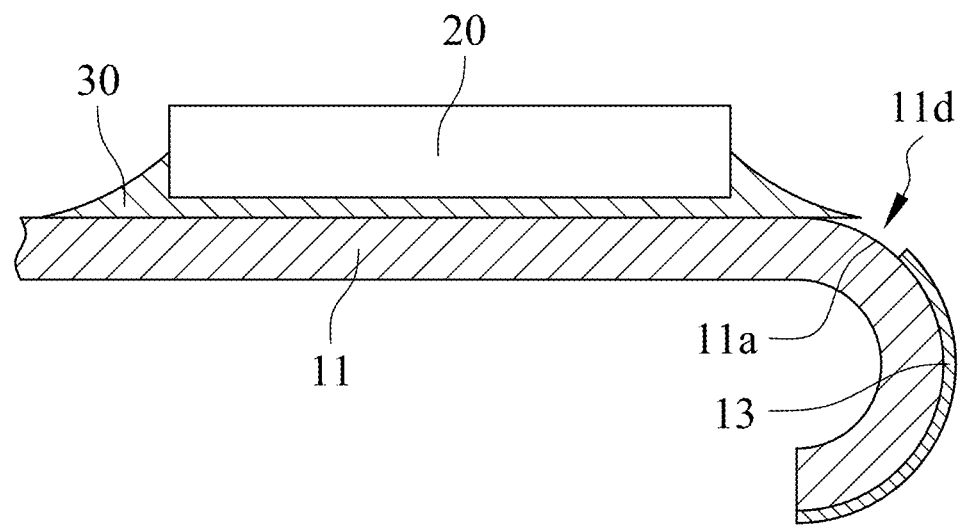
FIG. 2 is a cross-section view diagram illustrating a conventional semiconductor package.
Figure 3:
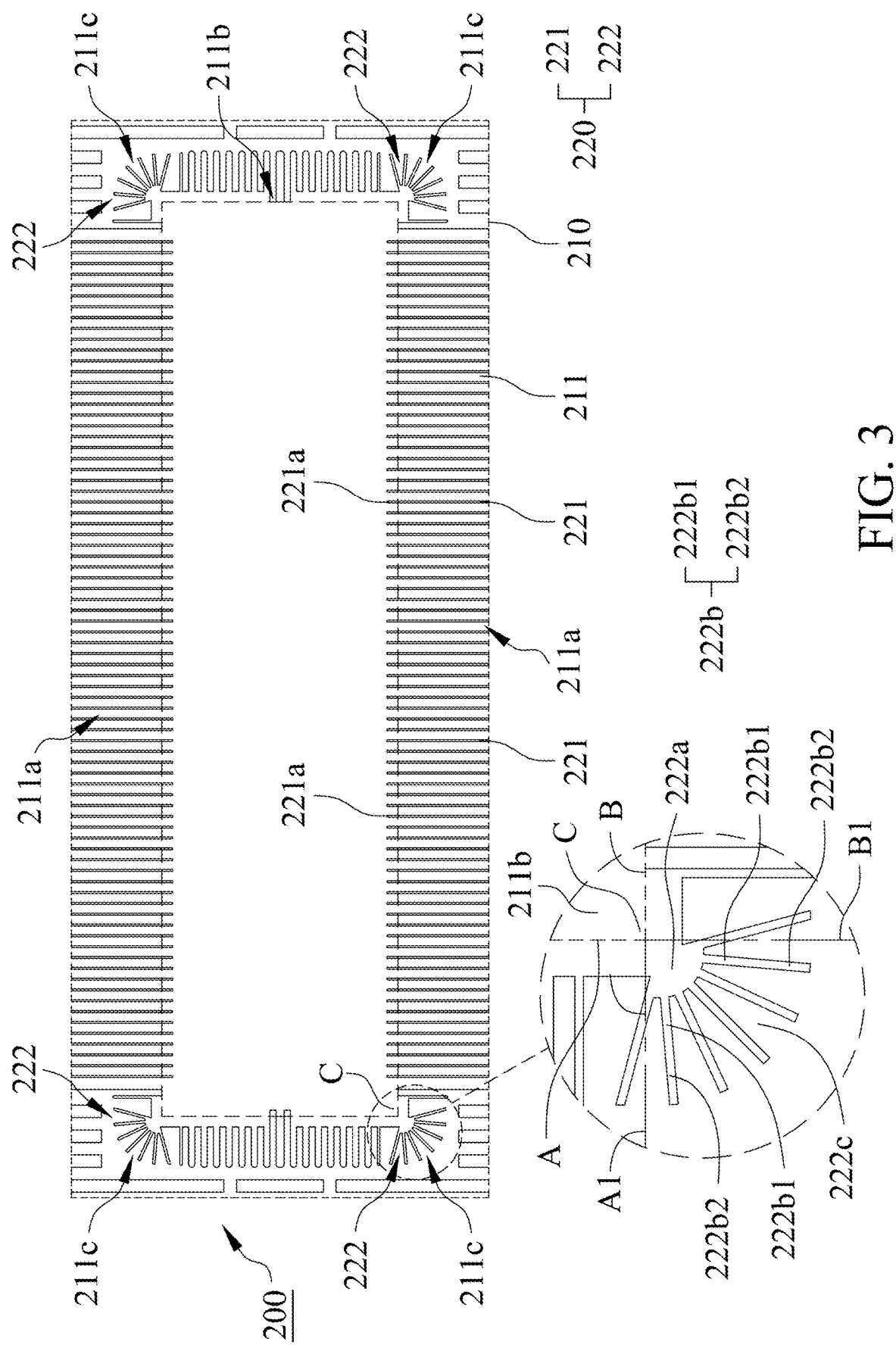
FIG. 3 is a top view diagram illustrating a circuit board in accordance with one embodiment of the present invention.
Figure 5:
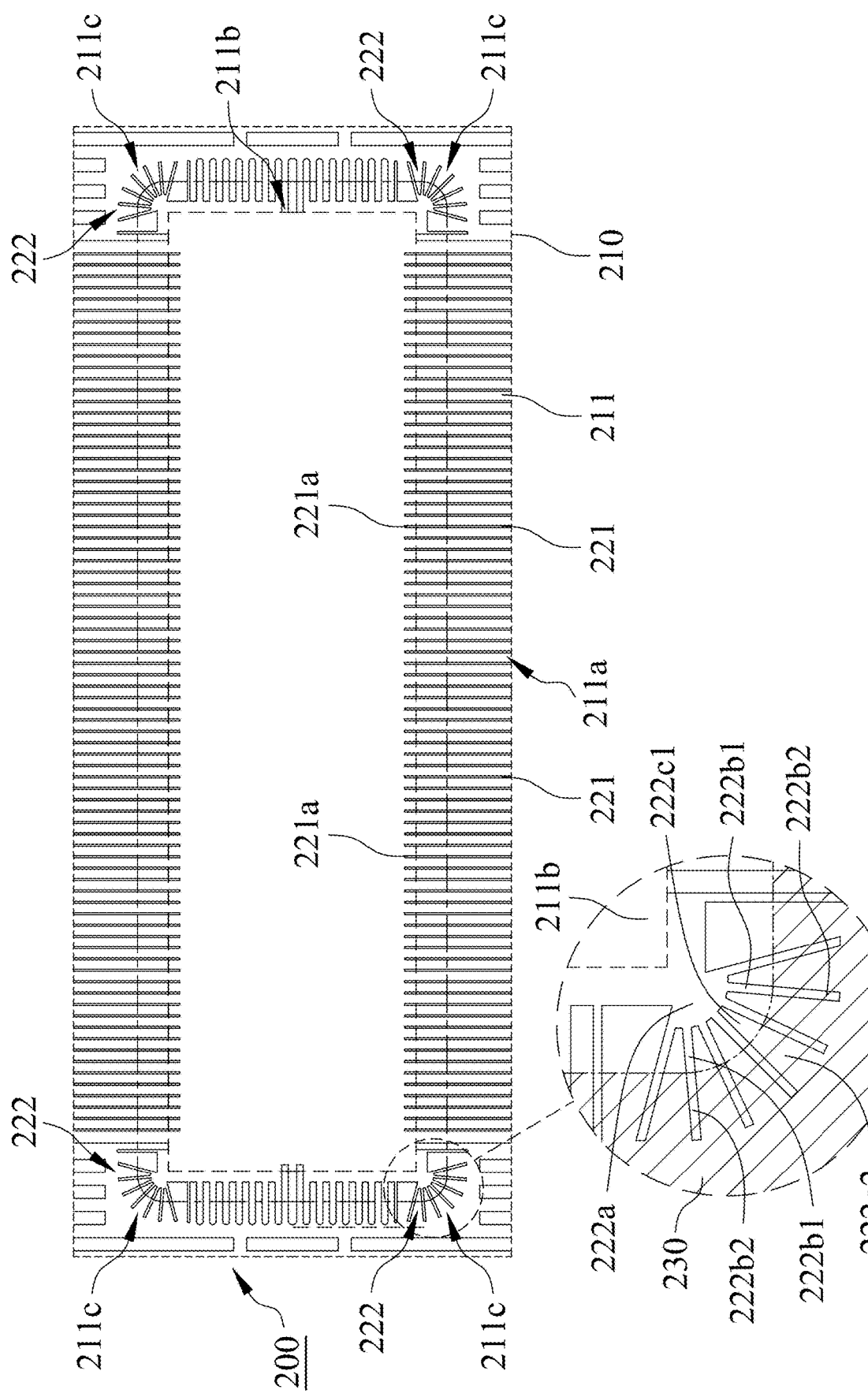
FIG. 5 is a top view diagram illustrating a circuit board in accordance with one embodiment of the present invention.
Figure 8:
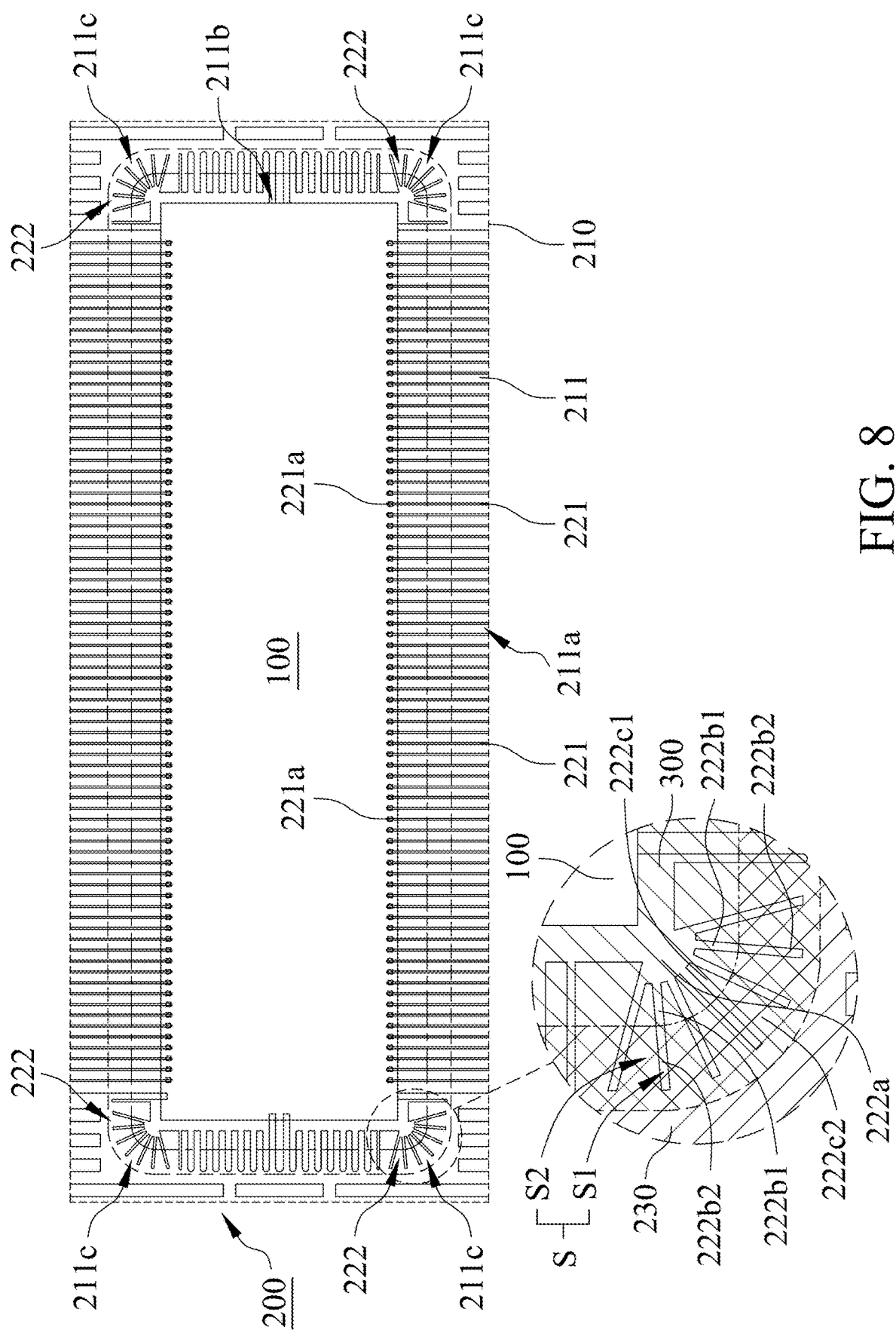
FIG. 8 is a top view diagram illustrating a semiconductor package in accordance with one embodiment of the present invention.
Figure 11:
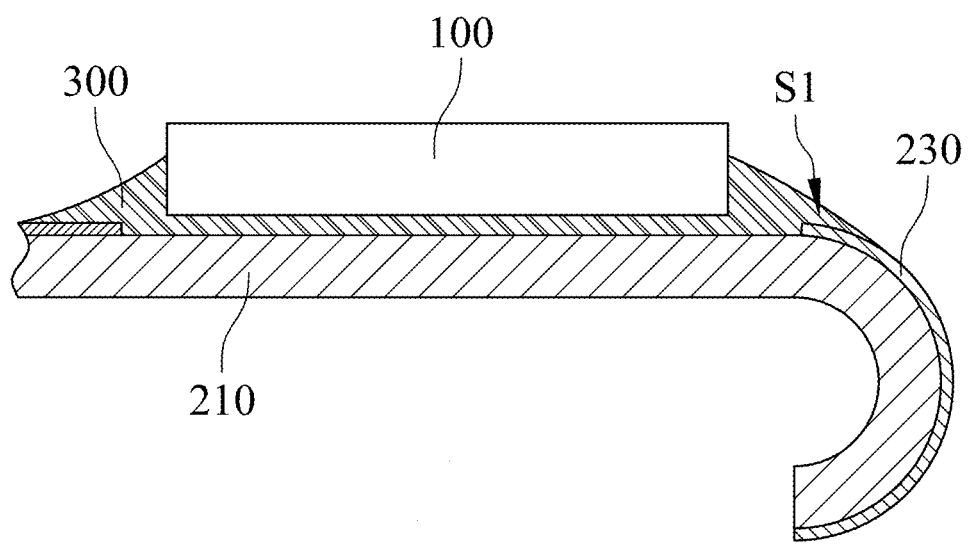
FIG. 11 is a cross-section view diagram illustrating a semiconductor package in accordance with one embodiment of the present invention.

As shown in FIGS. 8 and 11, a semiconductor package in accordance with one embodiment of the present invention includes a chip 100, a circuit board 200 and a filling material 300. With reference to FIGS. 3 and 5, the circuit board 200 includes a substrate 210, a patterned metal layer 220 and a protective layer 230. A circuit area 211a, a chip-mounting area 211b and a flow-guiding area 211c are defined on a surface 211 of the substrate 210, the circuit area 211a is located outside of the chip-mounting area 211b, and the chip 100 is provided to be mounted on the chip-mounting area 211b.

Figure 4:
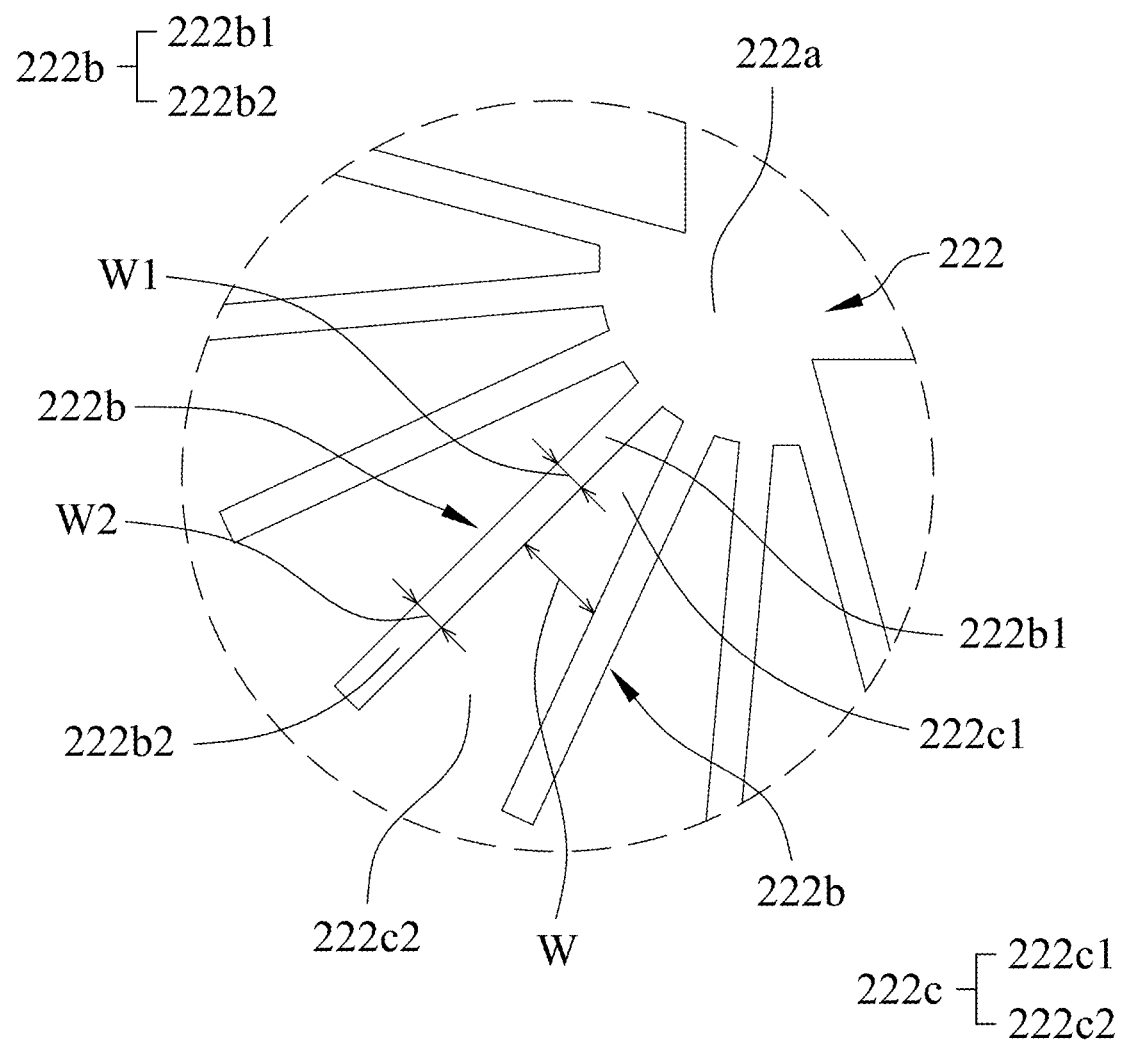
FIG. 4 is a partial enlarged diagram illustrating a flow-guiding member of a circuit board in accordance with one embodiment of the present invention.

With reference to FIGS. 3 and 4, a first boundary line A and a second boundary line B of the chip-mounting area 211b intersect at a corner C of the chip-mounting area 211b. A first imaginary line A1 extends from the first boundary line A, and a second imaginary line B1 extends from the second boundary line B. The flow-guiding area 211c is defined between the first imaginary line A1 and the second imaginary line B1, and it is adjacent to the circuit area 211a.

With reference to FIGS. 3 and 4, the patterned metal layer 220 includes a plurality of circuit lines 221 and at least one flow-guiding member 222. The circuit lines 221 are arranged on the circuit area 211a, an inner lead 221a of each of the circuit lines 221 is located on the chip-mounting area 211b and provided to be electrically connected to the chip 100. The flow-guiding member 222 is arranged on the flow-guiding area 211c and includes a hollow portion 222a and a plurality of flow-guiding grooves 222b, the flow-guiding grooves 222b are communicated with the hollow portion 222a and arranged radially. The hollow portion 222a is located adjacent to the corner C and located between the corner C and the flow-guiding grooves 222b. Each of the flow-guiding grooves 222b is divided into a first guiding portion 222b1 and a second guiding portion 222b2 which are communicated with each other. The first guiding portion 222b1 is communicated with the hollow portion 222a and located between the hollow portion 222a and the second guiding portion 222b2. A first width W1 of the first guiding portion 222b1 is substantially equal to a second width W2 of the second guiding portion 222b2.

With reference to FIGS. 3 and 4, in this embodiment, the flow-guiding member 222 further includes a plurality of spacer ribs 222c which are arranged radially from the hollow portion 222a. Each of the spacer ribs 222c is located between the two adjacent flow-guiding grooves 222b and includes a first spacer portion 222c1 and a second spacer portion 222c2. The first spacer portion 222c1 is located between the two adjacent first guiding portions 222b1, and the second spacer portion 222c2 is located between the two adjacent second guiding portions 222b2. A width W of each of the spacer ribs 222c is increased gradually from the first spacer portion 222c1 toward the second spacer portion 222c2.

Figure 6:
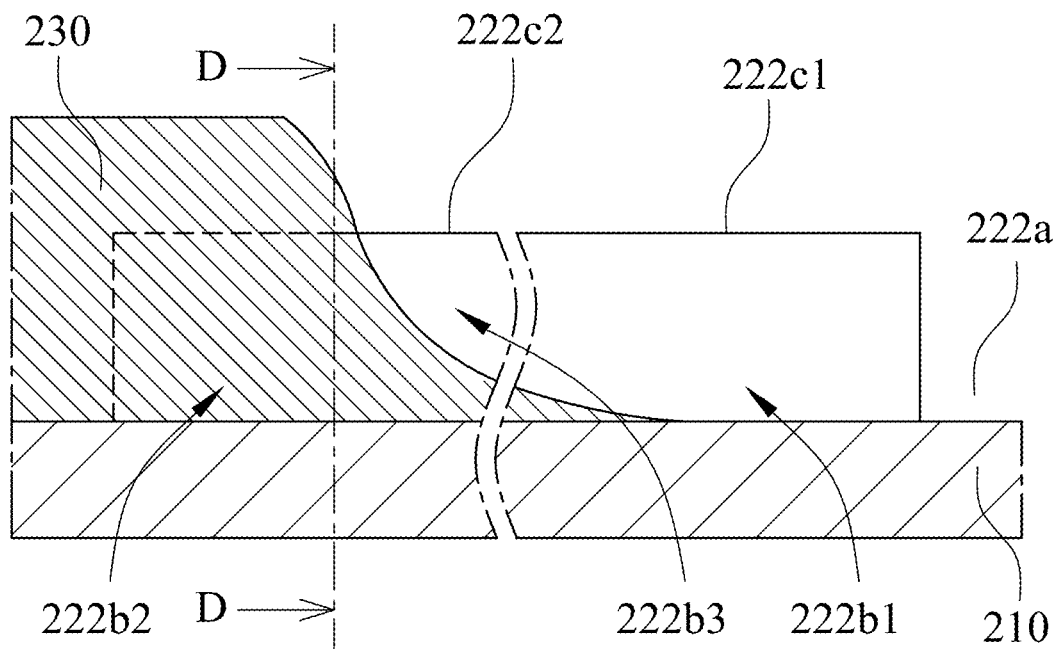
FIG. 6 is cross-section view diagram illustrating a flow-guiding member covered by a protective layer in accordance with one embodiment of the present invention.
Figure 7:
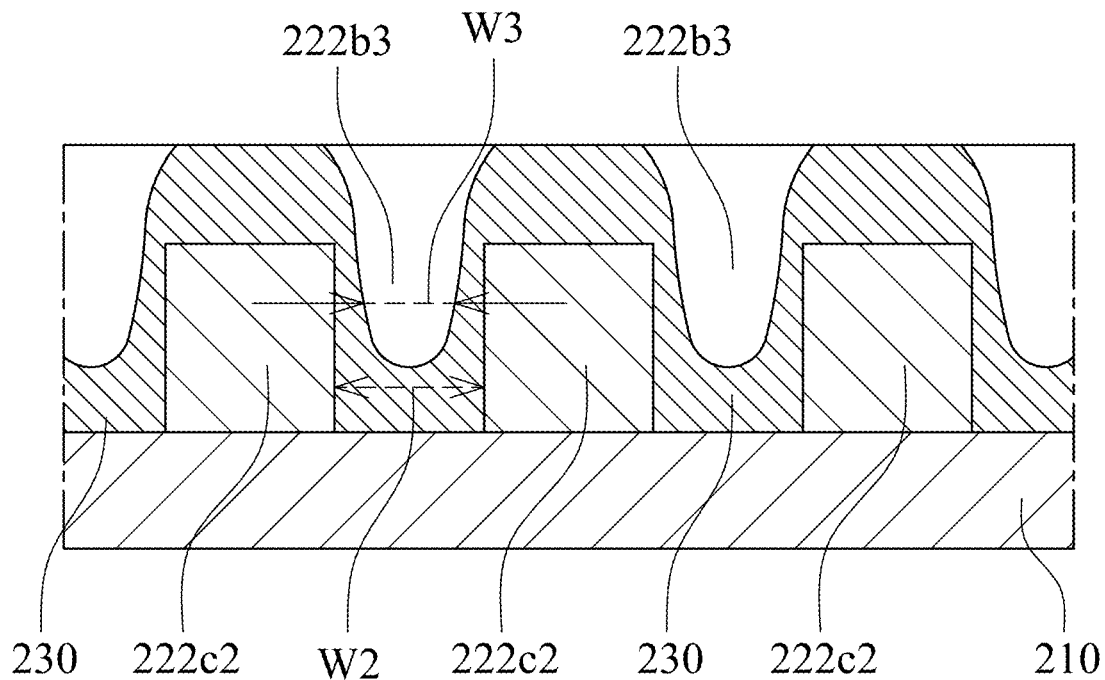
FIG. 7 is a cross-section view along D-D line of FIG. 6.

With reference to FIGS. 5 to 7, preferably, a solder mask ink is coated by screen printing on the substrate 210 and cured to become the protective layer 230 which is located on the substrate 210 and provided to cover the circuit lines 221. The second guiding portion 222b2 of each of the flow-guiding grooves 222b is provided to guide the protective layer 230 (the solder mask ink before curing) to flow toward the first guiding portion 222b1 of each of the flow-guiding grooves 222b and the hollow portion 222a such that the protective layer 230 can cover the second spacer portion 222c of each of the spacer ribs 222c and fill in the second guiding portion 222b2 of each of the flow-guiding grooves 222b. As shown in FIG. 5, the protective layer 230 does not cover the inner leads 211a, the hollow portion 222a, the first guiding portion 222b1 of each of the flow-guiding grooves 222b and the first spacer portion 222c1 of each of the spacer ribs 222c.

With reference to FIGS. 5 and 6, each of the flow-guiding grooves 222b further includes a third guiding portion 222b3 in the direction from the second guiding portion 222b2 toward the first guiding portion 222b1, the third guiding portion 222b3 is located on the protective layer 230 which is filled in the second guiding portion 222b2. With reference to FIGS. 4, 6 and 7, the third guiding portion 222b3 is communicated with the first guiding portion 222b1 and has a third width W3 which is less than or equal to the second width W2 of the second guiding portion 222b2.

Figure 9:
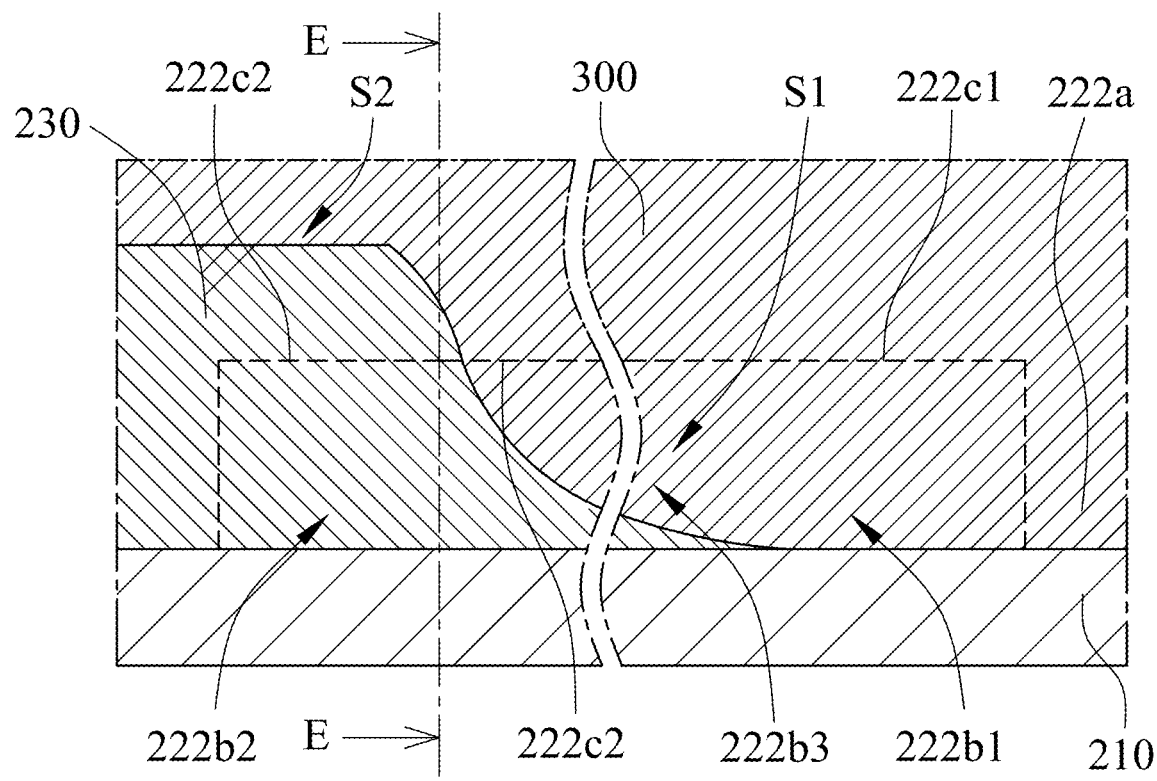
FIG. 9 is a cross-section view diagram illustrating a flow-guiding member covered by a protective layer and a filling material in accordance with one embodiment of the present invention.
Figure 10:
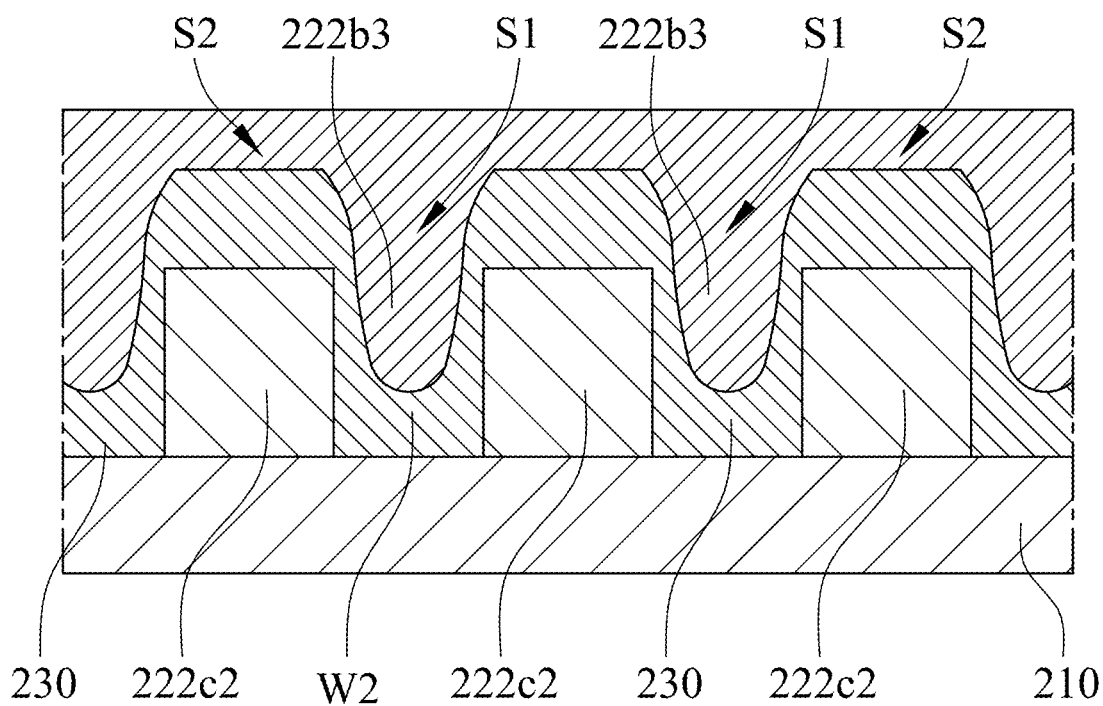
FIG. 10 is a cross-section view along E-E line of FIG. 9.

With reference to FIGS. 8 to 10, the chip 100 is placed on the chip-mounting area 211b and electrically connected to the inner leads 221a, and the filling material 300 is applied between the chip 100 and the circuit board 200. Before curing, the filling material 300 is directed to flow from the corner C to the second guiding portion 222b2 via the hollow portion 222a and the first guiding portion 222b1 of each of the flow-guiding grooves 222b. Thus, the filling material 300 can cover the hollow portion 222a, the first guiding portion 222b1 and the first spacer portion 222c1 located on the flow-guiding area 211c, and can cover the protective layer 230 located in the second guiding portion 222b2 and the protective layer 230 located on the second spacer portion 222c2. In this embodiment, the filling material 300 is directed to flow through the first guiding portion 222b1 to cover the third guiding portion 222b3. The protective layer 230 and the filling material 300 located in the second guiding portion 222b2 are overlapped to become a first overlapped bonding layer S1, and the protective layer 230 and the filling material 300 located on the second spacer portion 222c2 are overlapped to become a second overlapped bonding layer S2. An overlapped bonding structure S consists of the first overlapped bonding layer 51 and the second overlapped bonding layer S2 and allows the protective layer 230 and the filling material 300 to be coupled together on the flow-guiding area 211c.

With reference to FIGS. 8 and 11, the protective layer 230 can be directed to flow toward the first guiding portion 222b1 of each of the flow-guiding grooves 222b and the hollow portion 222a via the second guiding portion 222b2 of each of the flow-guiding grooves 222b, and the filling material 300 can be directed to flow from the corner C to the second guiding portion 222b2 of each of the flow-guiding grooves 222b via the hollow portion 222a and the first guiding portion 222b1 of each of the flow-guiding grooves 222b. Consequently, the hollow portion 222a, the first guiding portion 222b1, the protective layer 230 located in the second guiding portion 222b2 and the protective layer 230 located on the second spacer portion 222c2 are covered by the filling material 300 to allow the protective layer 230 and the filling material 300 to be connected with each other. In the present invention, it is able to prevent the filling material 300 from peeling off from the hollow portion 222a and prevent the inner leads 221a from being damaged and breaking away from the circuit lines 221. Moreover, the protective layer 230 and the filling material 300 coupled together can improve structure strength of the semiconductor package of the present invention.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor package comprising:
    a circuit board comprising:
        a substrate including a surface, a circuit area, a chip-mounting area and a flow-guiding area are defined on the surface, the circuit area is located outside of the chip-mounting area, a first boundary line and a second boundary line of the chip-mounting area are configured to intersect at a corner of the chip-mounting area, a first imaginary line is configured to extend from the first boundary line and a second imaginary line is configured to extend from the second boundary line, the flow-guiding area is located between the first and second imaginary lines;
        a patterned metal layer including a plurality of circuit lines and at least one flow-guiding member, the plurality of circuit lines are disposed on the circuit area, an inner lead of each of the plurality of circuit lines is located on the chip-mounting area, the at least one flow-guiding member is disposed on the flow-guiding area and includes a hollow portion and a plurality of flow-guiding grooves, the hollow portion is located adjacent to the corner and located between the corner and the plurality of flow-guiding grooves, the plurality of flow-guiding grooves are communicated with the hollow portion and arranged radially, each of the plurality of flow-guiding grooves includes a first guiding portion and a second guiding portion which are communicated with each other, the first guiding portion is located between the hollow portion and the second guiding portion and is communicated with the hollow portion; and
        a protective layer configured to cover the plurality of circuit lines and be filled in the second guiding portion of each of the plurality of flow-guiding grooves, the protective layer is configured to not cover the inner lead of each of the plurality of circuit lines, the hollow portion and the first guiding portion of each of the plurality of flow-guiding grooves;
    a chip mounted on the chip-mounting area and electrically connected to the inner lead of each of the plurality of circuit lines; and
    a filling material provided between the chip and the circuit board and configured to cover the hollow portion, the first guiding portion of each of the plurality of flow-guiding grooves and the protective layer located in the second guiding portion of each of the plurality of flow-guiding grooves, wherein the protective layer and the filling material located in the second guiding portion of each of the plurality of flow-guiding grooves are configured to be overlapped to become a first overlapped bonding layer.

2. The semiconductor package in accordance with claim 1, wherein the at least one flow-guiding member further includes a plurality of spacer ribs which are arranged radially from the hollow portion, each of the plurality of spacer ribs is located between the two adjacent flow-guiding grooves and includes a first spacer portion and a second spacer portion, the first spacer portion is located between the first guiding portion of the two adjacent flow-guiding grooves, the second spacer portion is located between the second guiding portion of the two adjacent flow-guiding grooves, the protective layer is configured to cover the second spacer portion and not cover the first spacer portion.

3. The semiconductor package in accordance with claim 2, wherein the filling material is configured to cover the first spacer portion and the protective layer which is located on the second spacer portion, the protective layer and the filling material located on the second spacer portion are configured to be overlapped to become a second overlapped bonding layer, an overlapped bonding structure of the protective layer and the filling material is configured to consist of the first and second overlapped bonding layers.

4. The semiconductor package in accordance with claim 2, wherein a width of each of the plurality of spacer ribs is increased gradually from the first spacer portion toward the second spacer portion.

5. The semiconductor package in accordance with claim 2, wherein each of the plurality of flow-guiding grooves further includes a third guiding portion, the third guiding portion is located on the protective layer which is filled in the second guiding portion, and the third guiding portion is communicated with the first guiding portion, the filling material is configured to cover the third guiding portion.

6. The semiconductor package in accordance with claim 1, wherein a first width of the first guiding portion is equal to a second width of the second guiding portion.

7. The semiconductor package in accordance with claim 1, wherein each of the plurality of flow-guiding grooves further includes a third guiding portion, the third guiding portion is located on the protective layer which is filled in the second guiding portion, and the third guiding portion is communicated with the first guiding portion, the filling material is configured to cover the third guiding portion.

8. The semiconductor package in accordance with claim 7, wherein the first guiding portion has a first width, the second guiding portion has a second width, and the third guiding portion has a third width, the third width is less than or equal to the second width.

9. The semiconductor package in accordance with claim 8, wherein the first width of the first guiding portion is equal to the second width of the second guiding portion.

10. A circuit board comprising:
a substrate including a surface, a circuit area, a chip-mounting area and a flow-guiding area are defined on the surface, the circuit area is located outside of the chip-mounting area, the chip-mounting area is configured for placement of a chip, a first boundary line and a second boundary line of the chip-mounting area are configured to intersect at a corner of the chip-mounting area, a first imaginary line is configured to extend from the first boundary line and a second imaginary line is configured to extend from the second boundary line, the flow-guiding area is located between the first and second imaginary lines;
a patterned metal layer including a plurality of circuit lines and at least one flow-guiding member, the plurality of circuit lines are disposed on the circuit area, an inner lead of each of the plurality of circuit lines is located on the chip-mounting area and is configured to be electrically connected to the chip, the at least one flow-guiding member is disposed on the flow-guiding area and includes a hollow portion and a plurality of flow-guiding grooves, the hollow portion is located adjacent to the corner and located between the corner and the plurality of flow-guiding grooves, the plurality of flow-guiding grooves are communicated with the hollow portion and arranged radially, each of the plurality of flow-guiding grooves includes a first guiding portion and a second guiding portion which are communicated with each other, the first guiding portion is located between the hollow portion and the second guiding portion and is communicated with the hollow portion; and
a protective layer configured to cover the plurality of circuit lines and be filled in the second guiding portion of each of the plurality of flow-guiding grooves, the protective layer is configured to not cover the inner lead of each of the plurality of circuit lines, the hollow portion and the first guiding portion of each of the flow-guiding grooves.

11. The circuit board in accordance with claim 10, wherein the at least one flow-guiding member further includes a plurality of spacer ribs which are arranged radially from the hollow portion, each of the plurality of spacer ribs is located between the two adjacent flow-guiding grooves and includes a first spacer portion and a second spacer portion, the first spacer portion is located between the first guiding portion of the two adjacent flow-guiding grooves, the second spacer portion is located between the second guiding portion of the two adjacent flow-guiding grooves, the protective layer is configured to cover the second spacer portion and not cover the first spacer portion.

12. The circuit board in accordance with claim 11, wherein the first spacer portion and the protective layer which is located on the second spacer portion are configured to be covered by a filling material.

13. The circuit board in accordance with claim 11, wherein a width of each of the plurality of spacer ribs is increased gradually from the first spacer portion toward the second spacer portion.

14. The circuit board in accordance with claim 11, wherein each of the plurality of flow-guiding grooves further includes a third guiding portion, the third guiding portion is located on the protective layer which is filled in the second guiding portion, and the third guiding portion is communicated with the first guiding portion, the third guiding portion is configured to be covered by a filling material.

15. The circuit board in accordance with claim 10, wherein a first width of the first guiding portion is equal to a second width of the second guiding portion.

16. The circuit board in accordance with claim 10, wherein each of the plurality of flow-guiding grooves further includes a third guiding portion, the third guiding portion is located on the protective layer which is filled in the second guiding portion, and the third guiding portion is communicated with the first guiding portion, the third guiding portion is configured to be covered by a filling material.

17. The circuit board in accordance with claim 16, wherein the first guiding portion has a first width, the second guiding portion has a second width, and the third guiding portion has a third width, the third width is less than or equal to the second width.

18. The circuit board in accordance with claim 16, wherein the first width of the first guiding portion is equal to the second width of the second guiding portion.

* * * * *